(12) United States Patent
Hester et al.

(10) Patent No.: US 6,288,663 B1
(45) Date of Patent: Sep. 11, 2001

(54) PIPELINED ANALOG-TO-DIGITAL CONVERTER WITH RELAXED INTER-STAGE AMPLIFIER REQUIREMENTS

(75) Inventors: Richard Knight Hester, Whitewright; William Joseph Bright, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/371,416

(22) Filed: Aug. 10, 1999

Related U.S. Application Data
(60) Provisional application No. 60/096,461, filed on Aug. 12, 1998.

(51) Int. Cl.[7] .................................................. H03M 1/12
(52) U.S. Cl. ........................................... 341/155; 341/161
(58) Field of Search ................................. 341/155, 156, 341/161, 159

(56) References Cited

U.S. PATENT DOCUMENTS

| | | | |
|---|---|---|---|
| 5,668,549 | * | 9/1997 | Opris et al. ........................... 341/118 |
| 5,710,563 | * | 1/1998 | Vu et al. .............................. 341/161 |
| 5,821,893 | * | 10/1998 | Kumamoto et al. ................. 341/161 |
| 5,861,832 | * | 1/1999 | Nagaraj ................................ 341/161 |
| 6,091,346 | * | 7/2000 | Muresan et al. ...................... 341/56 |
| 6,097,326 | * | 8/2000 | Opris et al. .......................... 341/161 |

OTHER PUBLICATIONS

Lewis et al., "A 10–b 20–Msample/s Analog–to–Digital Converter," IEEE Journal of Solid State Circuits, vol. 27, No. 3, Mar. 1991, pp. 351–358.

* cited by examiner

*Primary Examiner*—Peguy JeanPierre
(74) *Attorney, Agent, or Firm*—Alan K. Stewart; Wade James Brady, III; Frederick J. Telecky, Jr.

(57) ABSTRACT

This document describes a simple modification to the traditional pipelined analog-to-digital converter (ADC) architecture that reduces the signal swing of the inter-stage amplifier by a factor of two. This is a significant advantage when low power supply voltages limit the output range of operational amplifies. The modification requires no additional hardware and produces no additional power consumption.

20 Claims, 2 Drawing Sheets

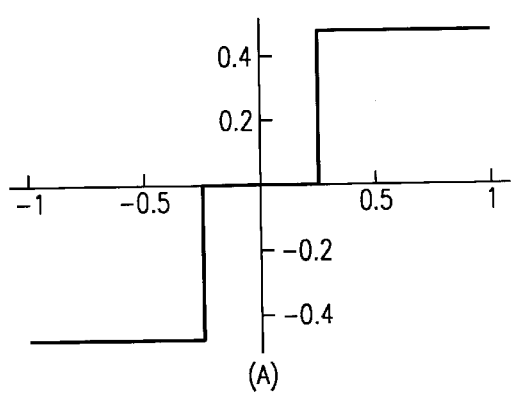
FIG. 3 *(PRIOR ART)*
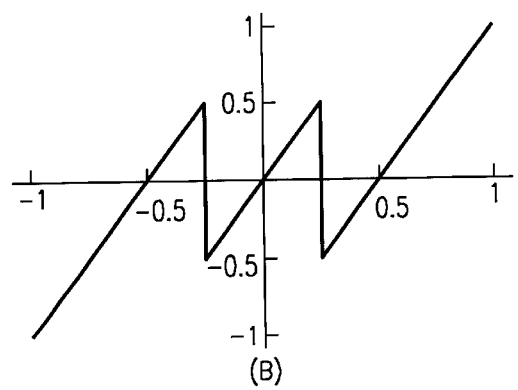
FIG. 4 *(PRIOR ART)*
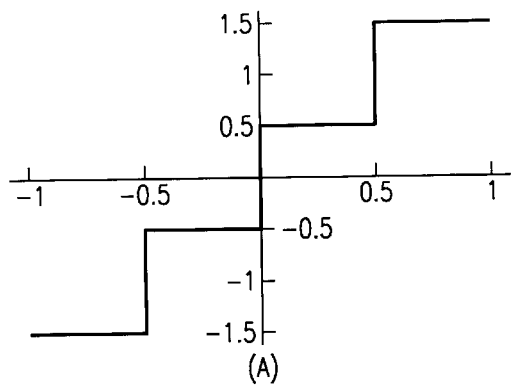
FIG. 5
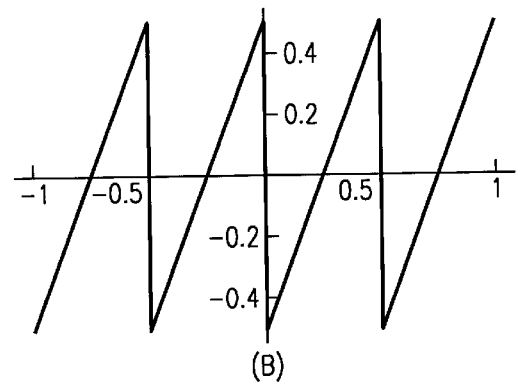
FIG. 6
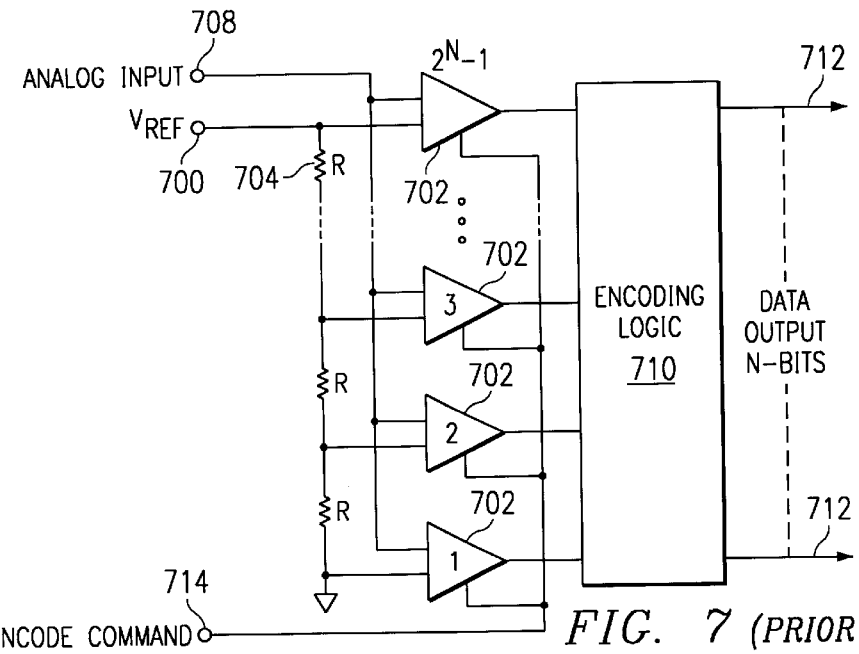
FIG. 7 *(PRIOR ART)*

US 6,288,663 B1

PIPELINED ANALOG-TO-DIGITAL CONVERTER WITH RELAXED INTER-STAGE AMPLIFIER REQUIREMENTS

This Application claim benefit to provisional Application No. 60/096,461 Aug. 12, 1998.

BACKGROUND AND SUMMARY OF THE INVENTION

The present invention relates to analog-to-digital converters and particularly to pipelined analog-to-digital converters with low power supply voltages.

Background: Analog to Digital Conversion

Analog to digital conversion is the process of converting an analog data signal, which is most commonly represented as voltage, into a digital format. Determining a digital value which represents a particular analog input is known as "quantization". Serial, delta-sigma or oversampling, parallel, and pipelined are some of the many different analog to digital conversion architectures which exist. Different architectures are suited to different needs.

Serial analog to digital architecture offers a wide range of performance in analog to digital conversion, from low power and low resolution to quantizations with very high resolutions. Serial architecture typically quantizes analog data at the rate of one bit per cycle. Therefore, a digital sample having N bits of resolution will take N cycles to fully quantize. Delta-sigma analog to digital architecture is used in audio signal processing. The architecture is designed to translate high-speed, low-resolution samples into higher-resolution, lower-speed output. This process is also referred to as oversampling because more samples of the analog data are quantized than actually become output.

By contrast, parallel analog to digital architecture provides the fastest quantization rate per analog signal. In the parallel (or "flash") architecture, a digital value per cycle is produced for each analog data sample, without regard to N, the number of bits of resolution. Parallel architecture requires that all quantization levels be simultaneously compared to the analog signal. This results in the use of $2^N-1$ comparators and $2^N+1$ resistors to achieve a digital value, with N bits of resolution, per cycle. FIG. 7 depicts a block diagram of a typical comparator configuration for a flash ADC. A three-comparator architecture, for example, will produce a digital output with two bits of resolution. The converter of FIG. 7 employs $2^n-1$ latched analog comparators 702 in parallel, where n is the number of bits of resolution. A reference voltage 706 is provided to the comparator bank. A resistive voltage divider 704 provides reference voltages scaled for each of the comparators. The outputs of the comparators are applied to latches controlled by the ENCODE input 714. When the encode command is low (digital "0"), the latches are transparent creating the "track" mode. When the ENCODE input changes to high (digital "1"), the latches go into a "hold" or latched condition, thus freezing the most recent digital outputs of the comparators and applying them to the encoding circuits 710. The signal held in the latches is converted to binary form by the encoders and applied to the output stages 712 as a digital representation of the analog signal 708 which was present at the comparator inputs at the instant the ENCODE command made the change to the "hold" mode.

Background: Pipelined Analog to Digital Architecture

Pipelined analog to digital architecture, like serial analog to digital architecture, is a method of quantizing an analog signal in stages. Algorithms exist for obtaining either 1 or 1.5 bits of resolution per stage. In a 1.5-bit per stage converter, the digital output of each stage is either 1, 0, or −1. In a 1-bit per stage converter, the digital output of each stage is either 1 or −1. For either algorithm, N stages are required for an N-bit digital value. One bit is resolved at each stage with the result and analog signal sample passed along to the next stage for resolution of another bit. In a 1.5 bit per stage converter, the other ½ bit in each stage is redundant. Digital correction logic eliminates the redundancy to produce an N bit result. Producing a single digital value for a single analog input requires N cycles, one for each stage. However, the pipelining permits a high degree of parallelism, so that one output per cycle can be produced after the pipeline fills up.

Pipelined analog to digital converters have many applications. They are particularly useful when high speed, high resolution quantization is required. The pipelined analog to digital conversion architecture's ability to meet these demands makes it ideal for high volume telecommunications application such as various digital subscriber lines, digital signal processing at video rates, and for stand alone high speed analog to digital converters.

The advantage of pipelined analog to digital conversion is that each stage of resolution is separated. Once the analog signal is resolved at the first stage and the result passed to the second stage, a new signal can be processed by the first stage. The passing of result and signal from stage to stage continues to stage N at which point a digital value of N bits of resolution can be produced. Quantization of the first signal to N bits of resolution is achieved in N cycles. However, because each stage resolves one bit and passes the result to the next stage, the former stage is free to resolve a bit of the next analog sample.

This staged design allows N analog samples to be in the process of quantization simultaneously. Once the first analog sample is quantized, after N cycles, each successive analog sample is quantized one cycle later. Thus, there is only one cycle delay per digitized signal after the first is fully quantized. Pipelined analog to digital conversion therefore results in the fastest throughput rate of any analog to digital conversion that quantizes one-bit per conversion cycle, as it is capable, after an N−1 cycles start up period, of quantizing one sample per cycle.

Background: Conventional Sub-ADC Solutions

FIG. 2 depicts a block diagram of the analog portion of a pipelined ADC. The pipelined ADC shown in FIG. 2 consists of N consecutive stages. Sub-ADC 202 is a low resolution analog-to-digital converter. Each sub-ADC performs a coarse conversion of its analog input signal to a digital approximation that is used to build the final digital ADC-output. The sub-ADC 202 output is also reconverted to an analog signal and subtracted from the sub-ADC 202 input. The inter-stage amplifier 204 multiplies this difference by a factor r. The amplifier output is be expressed by:

$$V_{RES} = r(V_{IN} - d\ V_{REF}/2),$$

where d represents the output of the sub-ADC 202. The multiplication factor, r, is often referred to as the converter radix. A radix of 2 is common for analog-to-digital converter stages of 1 or 1.5 bits per stage. The analog output of each stage is referred to as its residue. The digital output of the overall ADC is constructed by combining the outputs from each of the sub-ADC stages. The digital output is expressed by:

$$D = r_1 r_2 r_3 \ldots r_{N-1} d_1 + r_2 r_3 \ldots r_{n-1} d_1 + \ldots + r_{N-2} r_{N-1} d_1 + r_{N-1} d_1$$

where $d_k$ is the output of the $k^{th}$ sub-ADC and $r_k$ is the $k^{th}$ inter-stage amplifier gain.

The particular design choice of the sub-ADC 202 does not necessarily affect the accuracy of the overall ADC. However, the design choice can have a significant affect on the residue signal. This effect on the residue can make optimal performance of the inter-stage amplifier 204 difficult to achieve. The parameters incorporated in the design of a sub-ADC 202 include its output codes, $\{d_1, d_2, d_3 \ldots, d_M\}$, and the transition voltages necessary to produce the output codes, $\{V_{t2}, V_{t3}, V_{t4}, \ldots, V_{tM}\}$.

Background: Conventional Three-Comparator Sub-ADC

One commonly used three-comparator sub-ADC has three output codes, $\{-1, 0, 1\}$, and two transition voltages, $\{-V_{REF}/4, +V_{REF}/4\}$. This type of sub-ADC is typically used in CMOS pipelined ADC products. FIG. 3 graphically depicts the quantization law of this two-comparator sub-ADC. FIG. 4 graphically depicts the residue voltage corresponding to the quantization law of the sub-ADC. In both FIGS. 3 and 4 the axes have been normalized for a $V_{REF}$ of 1. According to FIG. 4, while the input to the common two-comparator stage is within $\pm 3V_{REF}/4$, the voltage residue will nominally be limited to $\pm V_{REF}/2$.

A sub-ADC such as that described above, when used in conjunction with a radix 2 inter-stage amplifier, results in a pipelined ADC stage with several advantages. The most important advantage of such an architecture is that the sub-DAC 206 and inter-stage amplifier 204 can be realized with a simple two-capacitor circuit in a switched capacitor configuration. The layout of the two capacitors can be arranged to eliminate completely the spatial variation of capacitance (that is, the difference in capacitance between nominally equal capacitors due to minor variations in the area of the plates comprising the capacitors). The low amplifier gain of two results in the retention of much of the speed of the amplifier during the amplification phase. Another advantageous attribute of this sub-ADC architecture is that the sub-ADC requires only two comparators. Further, the comparators themselves may possess offsets as large as $V_{REF}/4$ without exceeding the analog input range of the next stage.

However, the sub-ADC architecture described above has a major disadvantage. When the input magnitude of the sub-ADC input reaches $V_{REF}$ (or $-V_{REF}$), the inter-stage amplifier output magnitude also becomes $V_{REF}$ (or $-V_{REF}$). Open-loop gain in an operational amp is a function of output voltage with gain being its highest when the output is 0. Also, the accuracy of operational amp output decreases as open-loop gain of the operational amp decreases, resulting in greater residue error. Therefore, a sub-ADC architecture which requires full-scale residue signals, such as the one described above, can make substantially greater demands upon an inter-stage amplifier than one that does not At a full-scale output condition, the open-loop gain of the operational amp will be at its lowest, resulting in the greatest amount of residue error. The architecture described above not only requires full-scale residue signals, but also propagates such full-scale residue signals down the rest of the ADC pipeline. For example, if the initial ADC input, $V_{IN}$, is $-V_{REF}$, the first sub-ADC stage will produce a digital output of $-1$, according to the quantization law depicted in FIG. 3, and an analog residue signal error of $-V_{REF}$, according to the residue plot of FIG. 4. Additionally, each successive sub-ADC stage will produce the same result, a digital value of $-1$ and an analog residue signal error of $-V_{REF}$. The residue errors of each sub-ADC stage resulting from settling or amplifier finite gain are reproduced and accumulated at every stage.

Pipelined ADC with Relaxed Inter-Stage Amplifier

The present application discloses a pipelined analog-to-digital converter (ADC) architecture that reduces the signal swing of the inter-stage amplifier by a factor of two. Preferably, the first stage of an N-stage pipelined ADC is a three-comparator stage sub-ADC. The successive N–1 stages of the pipelined ADC are each preferably common two-comparator stage sub-ADCs. The nominal residue voltage of the first sub-ADC does not exceed $V_{REF}/2$. As input to the next successive sub-ADC, the nominal residue voltage limits the residue error to $\pm V_{REF}/2$. Therefore, the residue error is not propagated and accumulated at each successive sub-ADC stage in the pipeline. The disclosed pipelined ADC requires no more hardware than a traditional two-comparator stage pipelined ADC, which has as its last stage, a three-comparator sub-ADC. Consequently, the disclosed pipelined ADC also requires no additional power consumption over a traditional two-comparator stage pipelined ADC.

An advantage of the present disclosure is the reduction of the signal swing of inter-stage amplifiers by a factor of two. Such a reduction is significant when low power supply voltages limit the output range of operational amplifier.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 3 graphically depicts the quantization law of a common two-comparator sub-ADC.

FIG. 4 graphically depicts the residue voltage corresponding to the quantization law of a common sub-ADC.

FIG. 5 graphically depicts the quantization law of this sub-ADC.

FIG. 6 graphically depicts the residue voltage corresponding to the quantization law of the sub-ADC.

FIG. 7 depicts a block diagram of a typical comparator configuration for a flash ADC.

DETAILED DESCRIPTION OF THE PREFERRED EMBODIMENTS

Figure 1:
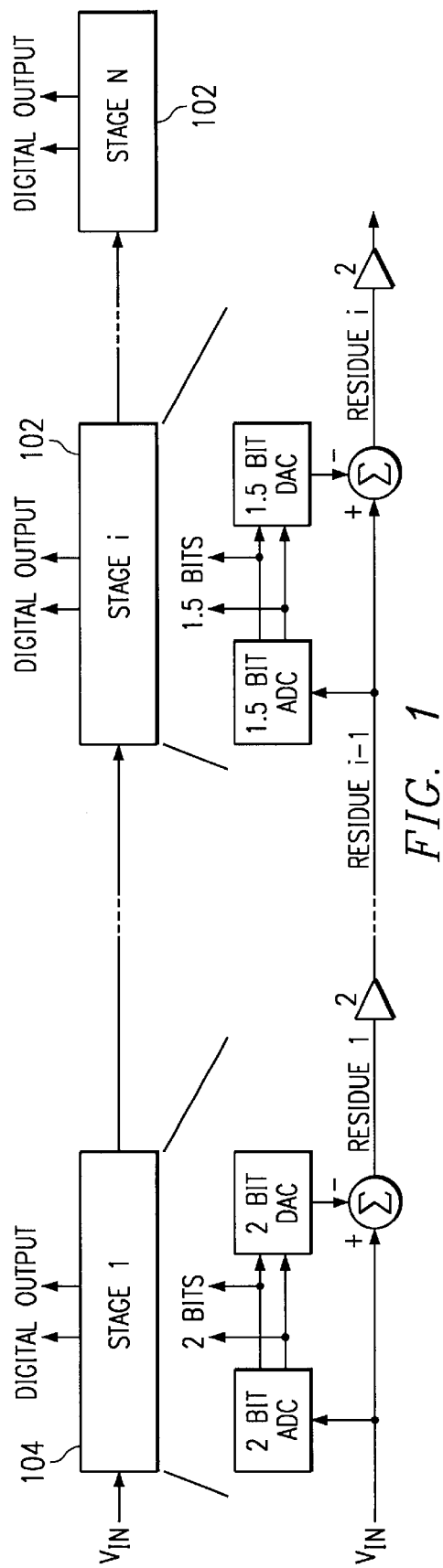
FIG. 1 depicts a block diagram of a pipelined analog-to-digital converter with relaxed inter-stage amplifier requirements.
Figure 2:
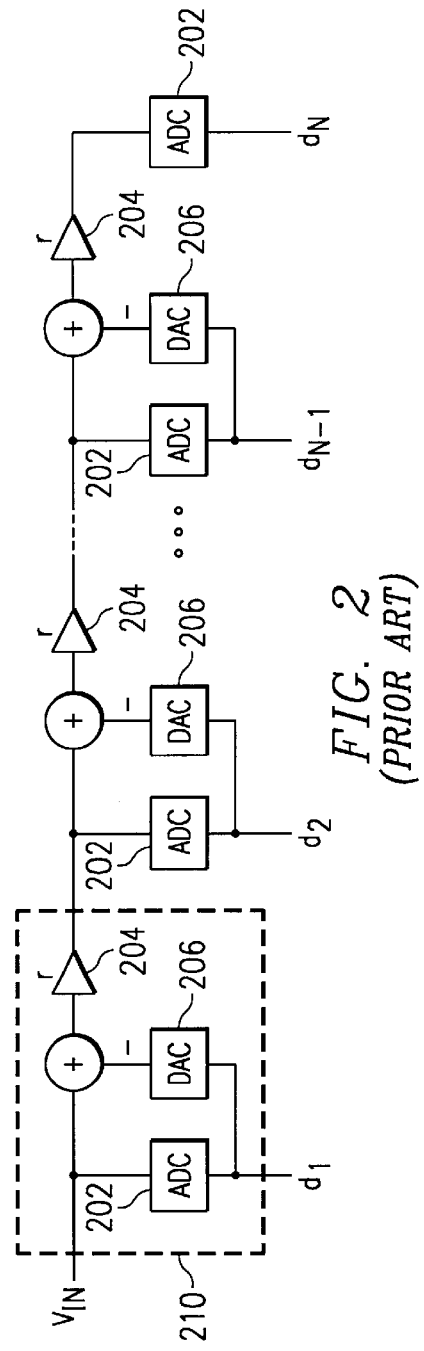
FIG. 2 depicts a block diagram of the analog portion of a pipelined ADC.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Residual Signal Magnitude Reduction

The disadvantages of the conventional sub-ADC stage described above can be overcome by taking steps to reduce the magnitude of the residual signal which is passed from the first stage of the pipelined ADC as input to the second stage. One technique of residue signal magnitude reduction is increase of the resolution of the sub-ADC of the first stage of the pipeline without increasing the gain of the inter-stage amplifier constant.

FIG. 5 graphically depicts the quantization law of a 2-bit sub-ADC. The quantization law depicted has output codes {-3/2, -1/2, 1/2, 3/2} with transition voltages {-$V_{REF}$/2, 0,+$V_{REF}$/2}. FIG. 6 graphically depicts the radix 2 residue voltages corresponding to the quantization law of FIG. 5. As is illustrated in FIG. 6, the residue magnitude will not exceed ±$V_{REF}$/2 while the analog input to the given stage does not exceed ±$V_{REF}$. The decrease in the magnitude of the residue signal is due to the increase in the resolution of the sub-ADC without a corresponding increase in radix. Any additional sub-ADC resolution will result in an even greater reduction in the magnitude of the residue signal for the given stage. However, any increase in the resolution of the sub-ADC carries with it a subsequent increase in costs. Such costs include space due to increased die area, heat and energy due to the increased power dissipation demand brought on by additional comparators and increased DAC complexity, and increased monetary costs due to greater die area and additional hardware.

Alternative Sub-ADC Solution

The cost increase outlined above can be avoided with an approach which requires sacrifice in the overall resolution of the pipelined ADC. This approach to minimizing the magnitude of the residue signal employs different sub-ADC output codes and transition voltages. The result of the approach is an avoidance of the increase in sub-ADC comparators. A sub-ADC with output codes {-2/3, 0, 2/3}, and transition voltages, {-$V_{REF}$/3,+$V_{REF}$/3} satisfies this approach. The magnitude of the residue signal of such a sub-ADC is nominally limited to 2$V_{REF}$/3.

In the above solution, sacrifice in resolution of the ADC results from a larger transition voltage. The input-referred least significant bit (LSB) size of the overall pipelined ADC is given by the separation of the transition voltages of the final stage (N) divided by the total inter-stage gain preceding stage (N). The LSB width produced by N commonly used stages 210 is then ($V_{REF}$/2)$2^{-(N-1)}$=$V_{REF}2^{-N}$. Since the input range of the overall ADC is -$V_{REF}$ to +$V_{REF}$, this is (N+1) bits of resolution. However, when the transition voltage difference is 2$V_{REF}$/3, the LSB width is (2$V_{REF}$/3)$2^{N-1}$, and the ADC has only (1.5)*$2_N$ codes, or (N+0.585)-bit resolution.

Presently Preferred Sub-ADC Solution

FIG. 1 depicts a block diagram of a pipelined analog-to-digital converter with relaxed inter-stage amplifier requirements. In the presently preferred embodiment, the input to the common two-comparator stage 102 is limited to ±3$V_{REF}$/4. This limitation on input voltage results in a residue which will nominally be limited to ±$V_{REF}$/2. The residue plot of FIG. 4 demonstrates this limitation. The input to the common two-comparator stage sub-DAC is limited to ±3$V_{REF}$/4 by making the first stage 104 of the pipelined analog-to-digital converter a three-comparator stage sub-DAC. The quantization law of three-comparator stage sub-DAC of the presently preferred embodiment is depicted in FIG. 5. As depicted in FIG. 6, the nominal residue magnitude of the three-comparator sub-DAC of FIG. 5 does not exceed ±$V_{REF}$/2 while the input voltage is within ±$V_{REF}$. Therefore, all subsequent stages 102 of the pipelined analog-to-digital converter can employ the common two-comparator stage sub-DAC architecture.

Effect of Comparator Offset

A comparator offset of δv causes an increase of rδv in the maximum residue at the corresponding code transition. This increase in maximum residue produces no overall ADC error unless the residue exceeds the input range of the next successive stage of the pipelined ADC or it exceeds the linear output range of the inter-stage amplifier.

The presently preferred embodiment is most useful if the magnitudes of comparator offsets are less than ±$V_{REF}$/8. The maximum ideal residue at the code transitions of a common two-comparator sub-ADC with a radix of two is $V_{REF}$/2. A comparator offset within ±$V_{REF}$/8 will limit the residue magnitude of the first stage to ±3$V_{REF}$/4 and that of the following stages to within ±$V_{REF}$/2 (assuming ideal comparators in the subsequent stage). In the presently preferred embodiment, a comparator offset of up to ±$V_{REF}$/4 can occur without overloading the input of the next stage. However, if an offset of ±$V_{REF}$/4 occurs, the resulting residue magnitude can reach ±$V_{REF}$. A resulting magnitude of ±$V_{REF}$ will reduce the advantage of the presently described disclosure but will still produce results equivalent to the common architecture.

Equivalent Number of Comparators

In any embodiment, the present disclosure requires no more comparators than current pipelined ADC architectures. An N-stage pipelined ADC employing the two-comparator sub-DAC architecture described above produces ($2^{N+1}$-1) codes from -($2^N$-1) to ($2^N$-1). The lowest and the highest codes produced are 50% wider than the intermediate codes. The traditional ADC quantization law is that code, -($2^N$-1), should not be oversized, and the lowest code should be -$2^2$ with half of the nominal width. In current two-comparator sub-DACs, the parameters are usually accomplished by adding a third comparator to the last stage of the pipelined ADC.

The technique described in the present disclosure renders the need for additional comparators in the final stage of the pipelined ADC unnecessary. The present disclosure employs three comparators in the first stage of the pipelined ADC, in effect, moving the extra comparator from the last stage to the first. This technique allows for relaxed inter-stage amplifier requirements without a corresponding overall increase in comparators. Thus, an N-stage pipelined ADC with a radix 2 first stage with sub-ADC output codes of {-3/2, -1/2, 3/2} and transition voltages of {-$V_{REF}$/2, 0,+$V_{REF}$/2} and (N-1) subsequent radix 2 stages having sub-ADC output codes of {-1, 0, 1} and transition voltages {-$V_{REF}$/4,+$V_{REF}$/4} reduces the signal swing of the interstage amplifiers by a factor of two without increased hardware or power consumption.

According to a disclosed class of innovative embodiments, there is provided: a method for pipelined analog to digital conversion, comprising the actions of performing a first stage of analog-to-digital conversion, on an analog input signal, using a first resolution; and performing one or more subsequent stages of analog-to-digital conversion using a second resolution which is coarser than said first resolution; said subsequent stage performing actions being pipelined, together with said first stage performing action, to provide a digital output signal; wherein the output codes of said first stage are not integrally related to the output codes of said subsequent stages and all said output codes contribute to form a digital value; and whereby said first resolution of said first stage limits signal swings seen by said subsequent stages, under some conditions.

According to another disclosed class of innovative embodiments, there is provided: a method for analog to digital conversion, comprising the steps of receiving an analog signal at a first stage of an analog-to-digital converter; producing a first digital value from said analog signal using a reference voltage; creating a first residue voltage relative to said digital value and said analog signal; and passing said first residue voltage to the next successive stage of said analog-to-digital converter; wherein said first stage has a resolution of more than 1.5 bits and the magnitude of said first residue voltage cannot exceed ±3/4 of said reference voltage.

According to another disclosed class of innovative embodiments, there is provided: a method for analog-to-digital conversion, comprising the steps of receiving an analog signal at a first stage of a serial analog-to-digital converter; converting said analog signal into a digital value; converting said digital value into an analog value using a reference voltage; subtracting said analog value from said analog signal to obtain a result; multiplying said result by a radix to produce a first residue voltage; and passing said first residue voltage to the next successive stage of said analog-to-digital converter; wherein said first stage has a resolution of more than 1.5 bits and the magnitude of said first residue voltage cannot exceed ±3/4 of said reference voltage.

According to another disclosed class of innovative embodiments, there is provided: a method for analog-to-digital conversion, comprising the steps of: for the first stage of an N-stage analog-to-digital converter receiving an analog signal; converting said analog signal to a digital value; converting said digital value to an analog value using a reference voltage; subtracting said analog value from said analog signal to obtain a result; multiplying said result by a radix to produce a first residue voltage; and passing said first residue voltage as input to the next successive stage of said analog-to-digital converter; and for each successive stage of said N-stage analog-to-digital converter: receiving said input; converting said input to a digital value; converting said digital value to an analog value; subtracting said analog value from said input to obtain a result; multiplying said result by a radix to produce a residue voltage; and passing said residue voltage as input to the next successive stage of said analog-to-digital converter; wherein said first stage has a resolution of more than 1.5 bits and the magnitude of said first residue voltage does not exceed ±3/4 of said reference voltage.

According to another disclosed class of innovative embodiments, there is provided: a pipelined analog to digital converter, comprising: a first stage of an analog-to-digital converter having a first resolution; and one or more subsequent analog-to-digital converter stages having a second resolution which is coarser than said first resolution; said first and subsequent stages being pipelined together to provide a digital output signal; wherein the output codes of said first stage are not integrally related to the output codes of said subsequent stages and all said output codes contribute to form a digital value; and whereby said first resolution of said first stage limits signal swings seen by said subsequent stages, under some conditions.

According to another disclosed class of innovative embodiments, there is provided: an analog to digital converter with a plurality of stages, comprising: a first stage with a resolution of more than 1.5 bits and producing a residue voltage with a magnitude which does not exceed ±3/4 of a reference voltage; and successive stages each with a resolution less than that of said first stage and connected to receive a residue voltage from a respective preceding stage and producing a residue voltage with a magnitude which does not exceed ±1/2 of said reference voltage.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the above described technique can be used in analog-to-digital converters other than those with pipelined architecture. Any ADC with an architecture that calls for a limited residue voltage can take advantage of the above disclosure.

It should also be noted that although the use of a three-comparator first-stage is described, additional stages may take advantage of the above described technique to further limit the residue voltage propagated to the rest of the stages.

It should also be noted that, over time, an increasing number of functions tend to be combined into a single chip. The disclosed inventions can still be advantageous even with different allocations of functions among chips, as long as the functional principles of operation described above are still observed.

Further details of the system context and of options for implementation may be found in Michael J. Demler, HIGH-SPEED ANALOG-TO-DIGITAL CONVERSION (1991); Analog Devices, Inc., ANALOG-DIGITAL CONVERSION HANDBOOK (1986); and Behzad Razavi, PRINCIPLES OF DATA CONVERSION SYSTEM DESIGN (1995); IEEE Journal of Solid-State Circuits March 1992 A 10B 20MSAMPLE/S ADC 351; all of which are hereby incorporated by reference.

What is claimed is:

1. A method for analog-to-digital conversion, comprising the steps of:
   receiving an analog signal at a first stage of a serial analog-to-digital converter;
   converting said analog signal into a digital value;
   converting said digital value into an analog value using a reference voltage;
   subtracting said analog value from said analog signal to obtain a result;
   multiplying said result by a radix to produce a first residue voltage; and
   passing said first residue voltage to the next successive stage of said analog-to-digital converter;
   wherein said first stage has a resolution of more than 1.5 bits and the magnitude of said first residue voltage cannot exceed ±3/4 of said reference voltage.

2. The method of claim 1 wherein a sub-ADC of said first stage has output codes $\{-3/2, -1/2, 1/2, 3/2\}$.

3. The method of claim 1 wherein a sub-ADC of said first stage has transition voltages $\{-V_{REF}/2, 0, V_{REF}/2\}$.

4. The method of claim 1 wherein said radix is two.

5. The method of claim 1 wherein the magnitude of said first residue voltage does not exceed ±1/2 of said reference voltage.

6. The method of claim 1 wherein the magnitude of a residue voltage of said next successive stage does not exceed ±1/4 of said reference voltage.

7. The method of claim 1 wherein said first stage is a three-comparator stage.

8. The method of claim 1 wherein said next successive stage is a two-comparator stage.

9. The method of claim 1 wherein the number of bits of resolution of said analog-to-digital converter is at least the total number of stages plus 1.

10. A method for analog-to-digital conversion, comprising the steps of:
   (a.) for the first stage of an N-stage analog-to-digital converter:
      (i.) receiving an analog signal;
      (ii.) converting said analog signal to a digital value;
      (iii.) converting said digital value to an analog value using a reference voltage;

(iv.) subtracting said analog value from said analog signal to obtain a result;
(v.) multiplying said result by a radix to produce a first residue voltage; and
(vi.) passing said first residue voltage as input to the next successive stage of said analog-to-digital converter; and (b.) for each successive stage of said N-stage analog-to-digital converter:
(i.) receiving said input;
(ii.) converting said input to a digital value;
(iii.) converting said digital value to an analog value;
(iv.) subtracting said analog value from said input to obtain a result;
(v.) multiplying said result by a radix to produce a residue voltage; and
(vi.) passing said residue voltage as input to the next successive stage of said analog-to-digital converter;

wherein said first stage has a resolution of more than 1.5 bits and the magnitude of said first residue voltage does not exceed ±3/4 of said reference voltage.

11. The method of claim 10 wherein a sub-ADC of said first stage has output codes {−3/2, −1/2, 1/2, 3/2}.

12. The method of claim 10 wherein a sub-ADC of said first stage has transition voltages {−$V_{REF}$/2, 0, $V_{REF}$/2}.

13. The method of claim 10 wherein said radix is two.

14. The method of claim 10 wherein the magnitude of said first residue voltage does not exceed ±1/2 of said reference voltage.

15. The method of claim 10 wherein the magnitude of the residue voltage of said next successive stage does not exceed ±1/4 of said reference voltage.

16. An analog to digital converter with a plurality of stages, comprising:
(a.) a first stage with a resolution of more than 1.5 bits and producing a residue voltage with a magnitude which does not exceed ±3/4 of a reference voltage; and
(b.) successive stages each with a resolution less than that of said first stage and connected to receive a residue voltage from a respective preceding stage and producing a residue voltage with a magnitude which does not exceed ±1/2 of said reference voltage.

17. The method of claim 16 wherein a sub-ADC of said first stage has output codes {−3/2, −1/2, 1/2, 3/2}.

18. The method of claim 16 wherein a sub-ADC of said first stage has transition voltages {−$V_{REF}$/2, 0, $V_{REF}$/2}.

19. The converter of claim 16 wherein the magnitude of said residue voltage of said first stage does not exceed ±1/2 of said reference voltage.

20. The converter of claim 16 wherein the magnitude of the residue voltage of said successive stages does not exceed ±1/4 of said reference voltage.

* * * * *